United States Patent [19]

Sato et al.

[11] Patent Number: 5,374,450
[45] Date of Patent: Dec. 20, 1994

[54] MANUFACTURING METHOD OF MAGNETIC DISK

[75] Inventors: Motoharu Sato; Yoshihiko Onishi, both of Kobe, Japan

[73] Assignee: Kabushiki Kaisha Kobe Seiko Sho, Kobe, Japan

[21] Appl. No.: 37,178

[22] Filed: Mar. 24, 1993

Related U.S. Application Data

[63] Continuation of Ser. No. 857,446, Mar. 25, 1992, abandoned.

[30] Foreign Application Priority Data

Mar. 25, 1991 [JP] Japan ................... 3-060219

[51] Int. Cl.$^5$ ............................ H01F 10/02
[52] U.S. Cl. ................... 427/130; 427/131; 427/132
[58] Field of Search ............ 427/131, 132, 130; 428/900, 64, 695, 928

[56] References Cited

U.S. PATENT DOCUMENTS

| | | |
|---|---|---|
| 4,390,562 | 6/1983 | Yanagisawa . |
| 4,824,539 | 4/1989 | Komoda ................. 427/131 X |

FOREIGN PATENT DOCUMENTS

| | | |
|---|---|---|
| 2024867 | 3/1991 | Canada . |
| 0228688 | 7/1987 | European Pat. Off. . |
| 0391423 | 10/1990 | European Pat. Off. . |
| 0447948 | 9/1991 | European Pat. Off. . |
| 3117931 | 7/1993 | Germany . |
| 64-65121 | 3/1989 | Japan . |
| 1466041 | 3/1977 | United Kingdom . |
| 2245599 | 1/1992 | United Kingdom . |

OTHER PUBLICATIONS

Japanese Patent, Laid-Open No., HER 2-73924; Preliminary Lecture Notes for Spring Meeting of Applied Physical Society, 29a-Y-8, p. 60, 1990 (Mo. not available).

German Official Letter Dated Jun. 28, 1993 W/English Translation.

*Primary Examiner*—Bernard Pianalto
*Attorney, Agent, or Firm*—Oblon, Spivak, McClelland, Maier & Neustadt

[57] ABSTRACT

An object of the present invention is to obtain a magnetic disk which has a high coercive force. It has a constitution in which, at first, a Cr under layer, a magnetic layer of a Co alloy, and a protective layer, a Zr layer for example, are formed in order on a substrate, and it is heat-processed at a temperature of higher than 250° C. The Zr layer is changed to an oxide layer, etc. by the heating process and becomes a layer which functions as a protective layer, and on the other hand, a chemical compound of Zr and a non-magnetic element in the magnetic layer of a Co alloy, Cr for example, is not generated, so that the segregation of Cr into the crystalline grain boundaries of the magnetic layer of a Co alloy is more effectively expedited. Because of this, since magnetic interactions between the crystalline grains in the magnetic layer of a Co alloy are weakened, the disks having high coercive force can be obtained.

2 Claims, 5 Drawing Sheets

COERCIVE FORCE Hc (Oe)
CARBON SUBSTRATE, Si LAYER

COERCIVE FORCE Hc (Oe)
CARBON SUBSTRATE, Ta LAYER

COERCIVE FORCE Hc (Oe)

CARBON SUBSTRATE, Zr LAYER

MANUFACTURING METHOD OF MAGNETIC DISK

This application is a continuation of U.S. patent application Ser. No. 07/857,446, filed on Mar. 25, 1992, now abandoned.

BACKGROUND OF THE INVENTION

1. Field of the Invention

The present invention relates to a manufacturing method with which a magnetic disk having a high coercive force can be obtained.

2. Description of the Prior Art

The advancement of a magnetic disk for higher capacity and of a recording medium (magnetic layer) for higher recording density has been contrived to correspond to the increase in information quantity as is generally known. It is necessary to make the thickness of a recording medium thin to increase the recording density. From this point of view, in place of a coating disk which is considered to have a limit in decreasing the medium film thickness, a plating type magnetic disk having a constitution in which a metallic magnetic layer is formed on a substrate (disk substrate) with a plating method and a sputtered type magnetic disk having a constitution in which a metallic magnetic layer is formed on a substrate with a sputtering method are beginning to be paid attention and some of them are actually used.

It is an effective means to increase the coercive force of a magnetic layer for improving the recording density. In a sputtered type magnetic disk, a method is known to the public as a method to increase the coercive force, in which a magnetic layer being composed of a Co alloy such as Co-Ni-Cr or Co-Cr-Ta is formed with a sputtering method on a substrate in a state of higher temperature than the ordinary substrate temperature of 150° to 250° C. (Summary Notes of Lectures at 11th Meeting of the Applied Magnetic Society of Japan, 1 pA-10, p. 18, 1987, Ishikawa and others, for example). The method is an excellent one, and in mass production, however, there is a problem in an apparatus that a carrier for supporting a substrate can be heat-deformed because a magnetic layer is formed at a high temperature.

Because of this, the present inventors offered a method with which a magnetic disk of an improved coercive force can be obtained by a heating process at a temperature higher than 250° C. after the successive formation of an under layer of Cr, a magnetic layer of a Co alloy, and a protective layer on a carbon substrate being composed of vitrified carbon (Japanese Patent, laid-open number, HER 2-73924; Preliminary Lecture Notes for Spring Meeting of Applied Physical Society, 29a-Y-8, p. 60, 1990). In this case, a similar method is proposed about a magnetic disk having a constitution in which no Cr under layer is provided.

In the above-mentioned manufacturing method of a magnetic disk, it is considered that the coercive force increases with an operating mechanism as described below.

When a non-magnetic element, Cr, is contained in a magnetic layer of a Co alloy, the segregation of Cr into the crystalline grain boundaries is expedited by a heating process. Because of this, the magnetic separation between crystalline grains in the magnetic layer of a Co alloy is expedited, and magnetic interaction between crystalline grains is weakened, which is considered to be the cause of the increase of a coercive force. In a case where a Cr under layer is formed on a substrate, the surface of the Cr under layer (110) makes selective growth in making the thickness of the layer thicker, and the axis of easy magnetization (c axis) of a magnetic layer of a Co alloy can be easily oriented in the surface plane, and the diffusion of Cr into the crystalline grain boundaries in the magnetic layer of a Co alloy from the Cr under layer is expedited by the heating process, which is considered to be the cause of the increase of a coercive force.

SUMMARY OF THE INVENTION

In a process of execution of the method which was previously offered, it was found that when a heating process was performed after the formation of C layer being composed of C (carbon), a representative material for forming a protective layer, on the magnetic layer of a Co alloy, C forming the C layer is diffused into the magnetic layer of a Co alloy, and a Cr-C compound is generated by the reaction of C and Cr, a non-magnetic element in the magnetic layer of a Co alloy. It was clarified that the diffusion of C into the magnetic layer of a Co alloy caused by heat-processing the C forming a protective layer is the primary obstruction factor for obtaining high coercive force securely without dispersion.

The present invention is invented based on the consideration of the above-mentioned aspects, and the object of the invention is to offer a manufacturing method of a magnetic disk with which a magnetic disk having a high coercive force can be obtained.

In order to achieve the above-mentioned object, in a method for manufacturing a magnetic disk according to the invention described in claim 1, in which after the formation of a magnetic layer composed of a Co alloy and a protective layer in order on a substrate, the substrate is heat-processed at a temperature of more than 250° C., the protective layer is composed of a non-diffusive element which does not diffuse into the magnetic layer of a Co alloy in the heating process of the protective layer.

In the manufacturing method of a magnetic disk according to the invention described in claim 1, when a non-magnetic element, Cr for example, is contained in the magnetic layer of a Co alloy, the segregation of Cr into the crystalline grain boundaries is expedited. In this case, the protective layer is composed of a non-diffusive element which does not diffuse into the magnetic layer of a Co alloy when the protective layer is heat-processed. Therefore, a Cr compound composed of an element forming the protective layer and Cr in the magnetic layer of a Co alloy is not generated, so that the segregation of Cr into the crystalline grain boundaries in the magnetic layer of a Co alloy can be expedited more effectively. In the result, it is considered that the magnetic interaction between the crystalline grains in the magnetic layer of a Co alloy is weakened and the coercive force increases.

In the manufacturing method of a magnetic disk according to the invention described in claim 2, a chemical compound of an non-magnetic element in the magnetic layer of a Co alloy, Cr for example, and an element forming the protective layer is not generated, so that, similar to the above, the segregation of Cr into the crystalline grain boundaries in the magnetic layer of a Co alloy can be expedited more effectively. In addition, a Cr under layer is provided and the surface (110) of the Cr under layer grows selectively in making the thickness of the layer thicker and the axis of easy magnetization (c axis) can be oriented in the surface plane more easily, and also the segregation of Cr from the Cr under layer into the crystalline grain boundaries in the magnetic layer of a Co alloy is expedited; thereby the coercive force is considered to increase.

In the manufacturing method of a magnetic disk according to the present invention, the protective layer formed on the magnetic layer of a Co alloy is changed chemically into a substance being composed of an oxide, a nitride, boride or carbide by a heating atmosphere to a nonmagnetic protective layer having a function of protecting the magnetic layer of a Co alloy chemically and mechanically.

As a non-diffusive element for forming the above-mentioned protective layer, one kind of element selected from the following can be used, Li, Be, B, Na, Mg, Al, Si, P, S, K, Ca, Sc, Ti, V, Cr, Mn, Fe, Co, Ni, Cu, Zn, Ge, As, Se, Sr, Y, Zr, Nb, Mo, Ru, Rh, Pd, Ag, Cd, In, Sn, Sb, Te, I, Ba, La, Ce, Pr, Nd, Sm, Eu, Gd, Tb, Dy, Ho, Er, Tm, Yb, Lu, Hf, Ta, W, Re, Os, Ir, Pt, Au, Tl, Pb and Bi; or two kinds of elements selected from the following can be used, H, Li, Be, B, C, N, O, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Ru, Rh, Pd, Ag, Cd, In, Sn, Sb, Te, I, Cs, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Pb and Bi.

Thin films consisting of these elements can be deposited not only with a sputtering method but also with a vapor deposition method, a plating method or a chemical vapor deposition method, and they do not diffuse into the magnetic layer of a Co alloy during a heating process, and they have a protective function. The deposition method of the magnetic layer of a Co alloy and the Cr under layer is not limited to a sputtering method, and other methods such as a vapor deposition method, a chemical vapor deposition method or a plating method can be adopted.

In the case of a manufacturing method of a magnetic disk according to the present invention, the temperature in a heating process is higher than 250° C. In an atmosphere of lower than 250° C., it takes a long time to obtain the increase effect of a coercive force, which is not desirable. The upper limit temperature is 1450° C.; it is decided because of the reasons that the magnetic layer of a Co alloy itself is destroyed in a temperature higher than 1450° C., and also there is a limit based on the properties of a magnetic disk substrate. When a titanium substrate is used, for example, if the temperature in a heating process is higher than 885° C., the crystal structure of the titanium substrate is changed from a h.c.p.(hexagonal close packing) structure to a b.c.c. (body-centered cubic lattice) structure, and the phase change makes the surface of a magnetic layer rough, which exert bad influences on their characteristics. When a crystalline glass substrate is used, the transition point of the glass is 750° C., so that a temperature lower than that is desirable.

A carbon substrate, a titanium substrate, a crystalline glass substrate, a tempered glass substrate or a silicon substrate can be cited as a magnetic disk substrate to be used in the method according to the present invention.

As described in the above, in a manufacturing method of a magnetic disk according to the invention described in claim 1, a protective layer is formed by the use of a non-diffusive element which does not diffuse into the magnetic layer of a Co alloy when it is heated, and it is heated at a temperature higher than 250° C., so that the protective layer is changed to a layer being composed of oxide, etc. and it still functions as a protective layer. And a chemical compound of a material forming the protective layer and a non-magnetic element in the magnetic layer of a Co alloy, Cr for example, is not generated; thereby, the segregation of a non-magnetic element, Cr for example, into the crystalline grain boundaries in the magnetic substance layer of a Co alloy is expedited more effectively. Owing to this, the magnetic interaction between the crystalline grains is weakened and a magnetic disk having a high coercive force can be obtained.

In the manufacturing method of magnetic disk according to the invention described in claim 2, in a similar way to the above, the protective layer is changed to a layer being composed of an oxide or others which functions as a protective layer, and also a chemical compound composed of an element forming the protective layer and a non-magnetic element in the magnetic layer of a Co alloy, Cr for example, is not generated, so that the segregation of a non-magnetic element, Cr for example, into the crystalline grain boundaries in the magnetic layer of a Co alloy is expedited more effectively. In addition to this, since a Cr under layer is provided, the axis of easy magnetization (c axis) in the magnetic layer of a Co alloy can be easily oriented in the surface plane, and the diffusion of Cr from the Cr under layer to the crystalline grain boundaries in the magnetic layer of a Co alloy is expedited by a heating process; thereby, a magnetic disk having a high coercive force can be obtained.

DETAILED DESCRIPTION OF THE PREFERRED EMBODIMENTS

The present invention will be explained based on the embodiments in the following.

At first, an embodiment according to the invention described in claim 2 will be explained.

Embodiment 1

To begin with, the explanation of the manufacture of a carbon substrate as a substrate for a magnetic disk will be given. A phenol-formaldehyde resin, a thermosetting resin to be a vitreous carbon after carbonizing baking, was formed into a magnetic-disk shape and then a preparatory baking was performed at a temperature of 1000° to 1500° C. in an atmosphere of $N_2$ gas. Then it was HIP (Hot Isostatic Pressing)-processed applying an isotropic pressure of 2000 atmospheric pressure in heating it at a temperature of 2500° C. by using a hot Isostatic Pressing device (HIP). The obtained compacts are machined by a specified edge processing and a surface polishing, and finished to become a carbon substrate of 1.27 mm thick for a 3.5 inch disk.

On the manufactured carbon substrate, a Cr layer of 3000 Å thick as an under layer, a $Co_{62.5}Ni_{30}Cr_{7.5}$ layer of 600 Å thick as a magnetic layer of a Co alloy and a Zr layer of 300 Å thick as a protective layer were formed in order with the use of a DC magnetron sputtering system. The substrate temperature during a deposition was 250° C. The worked pieces were heat-processed changing the heating temperature in the range of 450° to 650° C. (refer to FIG. 1) for 1 min. in a vacuum atmosphere (degree of vacuum: $30 \times 10^{-2}$ Torr), and a disk was prepared in each heating condition.

Disks having a C layer in place of the above-mentioned Zr layer were prepared, and they were heat-processed changing the heating temperature in the range of 450° to 600° C. (refer to FIG. 1) for 1 min. in a vacuum atmosphere (degree of vacuum: $30 \times 10^{-2}$ Torr), and a disk was prepared in each heating condition for a comparison example.

Figure 1:
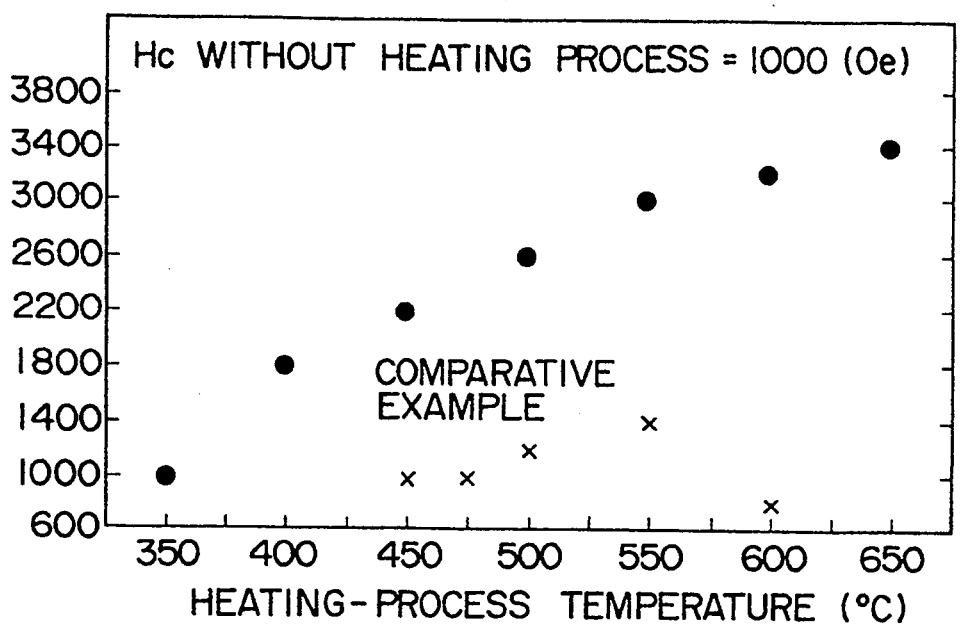
FIG. 1 is a chart showing an example of the relation between the heating process temperature and the coercive force of a disk obtained in an embodiment 1 according to the invention described in claim 2.

Samples having the dimensions of $8 \times 8$ mm were made from respective prepared disks, and after the layers on one side of each samples were removed their magnetic characteristics were measured with a vibrating sample magnetometer (VSM). The measured results of the coercive force, Hc, are shown in FIG. 1. The coercive force, Hc, before the heating processes were measured about the disks having the Zr layer and the C layer. The coercive forces, Hc, before the heating processes were approximately 1000 (Oe).

As seen from FIG. 1, according to the method shown in the embodiment, a chemical compound of Zr and Cr in the $Co_{6.25}Ni_{30}Cr_{7.5}$ layer is not generated, and the segregation of Cr into the crystalline grain boundaries in the $Co_{6.25}Ni_{30}Cr_{7.5}$ layer is expedited more effectively, so that magnetic disks having remarkably improved coercive force without dispersion were obtained in comparison with those which were not heat-processed and those in the comparison examples.

Thin film X-ray diffraction analysis and ESCA analysis were performed about the disks manufactured in the embodiment, and it was found that the Zr layer was changed to a Zr oxide layer. These samples were held for 10 days in an atmosphere of a temperature of 65° C. and a humidity of 85%. After the environmental test, their magnetic characteristics were measured with a vibrating sample magnetometer. In the result, there was no change in the values of coercive forces, Hc, the residual magnetic flux density, Br, and the degree of squareness, S, in comparison with the data before the environmental test, and it was confirmed that the Zr oxide layer has the function as a protective layer.

The C layer in a magnetic disk in comparison examples reacts with oxygen and changes to $CO_2$ gas during a heating process in a vacuum atmosphere and the thickness of the C layer is decreased. In the case of a C layer of 300 Å thick, for example, the thickness was decreased by 82 Å by a heating process at 300° C. for 1 min., the thickness was decreased by 118 Å by a heating process at 400° C. for 1 min., and the thickness was decreased by 268 Å by a heating process at 500° C. for 1 min. In contrast to this, in the case of a Zr layer, the decrease in thickness was not observed during a heating process in a vacuum atmosphere.

Embodiment 2

Disks were prepared in a similar method to that in the embodiment 1, excepting that a heating process was performed in the air atmosphere in place of a vacuum atmosphere.

Figure 2:
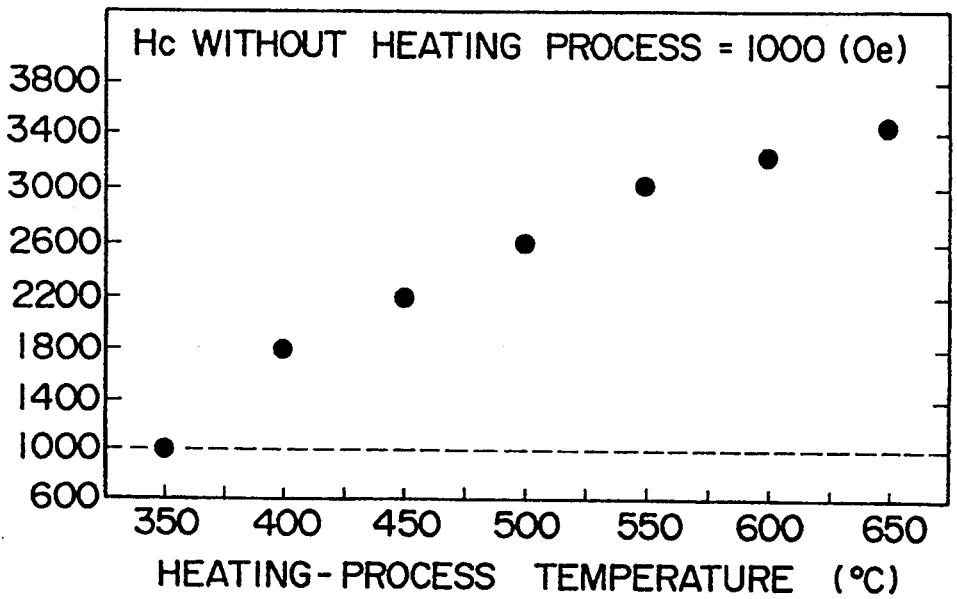
FIG. 2 is a chart showing an example of the relation between the heating-process temperature and the coercive force of a disk obtained in an embodiment 2 according to the invention described in claim 2.

The measurement results of the coercive force of the obtained disks are shown in FIG. 2. As seen from the figure, also in the case where heating processes were performed in the air atmosphere, the disks having coercive forces, Hc, which was remarkably improved were obtained in comparison with the disks without being subjected to heating processes or disks in the comparison examples in the embodiment 1.

Embodiment 3

Disks were prepared in a similar method to that in the embodiment 1, excepting that an Si layer was formed in place of a Zr layer as a protective layer.

Figure 3:
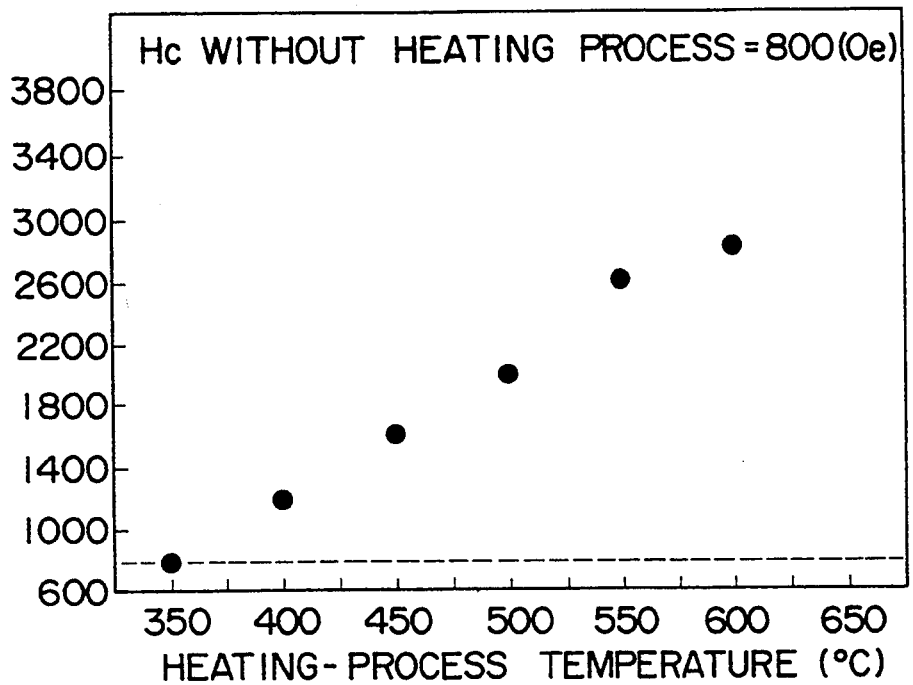
FIG. 3 is a chart showing an example of the relation between the heating-process temperature and the coercive force of a disk obtained in the embodiment 3 according to the invention described in claim 2.

The measurement results of the coercive force of the obtained disks are shown in FIG. 3. As seen from the figure, also in the case where protective layers were formed with Si, the disks having coercive force, Hc, which was remarkably improved were obtained in comparison with the disks without being subjected to heating processes or the disks in comparison examples in the embodiment 1.

About the magnetic disks prepared in this embodiment, composition analysis in the direction of depth (thickness) was performed with the ESCA (electron spectroscopy for chemical analysis) method. In the result, it was found that the Si layer was changed to an Si oxide layer by a heating process. In the result of a similar environmental test to that in the embodiment 1, there was no change in the values of the coercive force, Hc, the residual magnetic flux densities, Br, and the degrees of squareness, S, in comparison with those before the environmental test; thereby, it was confirmed that the Si oxide layer has the function as a protective layer.

Embodiment 4

Disks were prepared with a similar method to that in the embodiment 1, excepting that a Ta layer was formed in place of the Zr layer as a protective layer.

Figure 4:
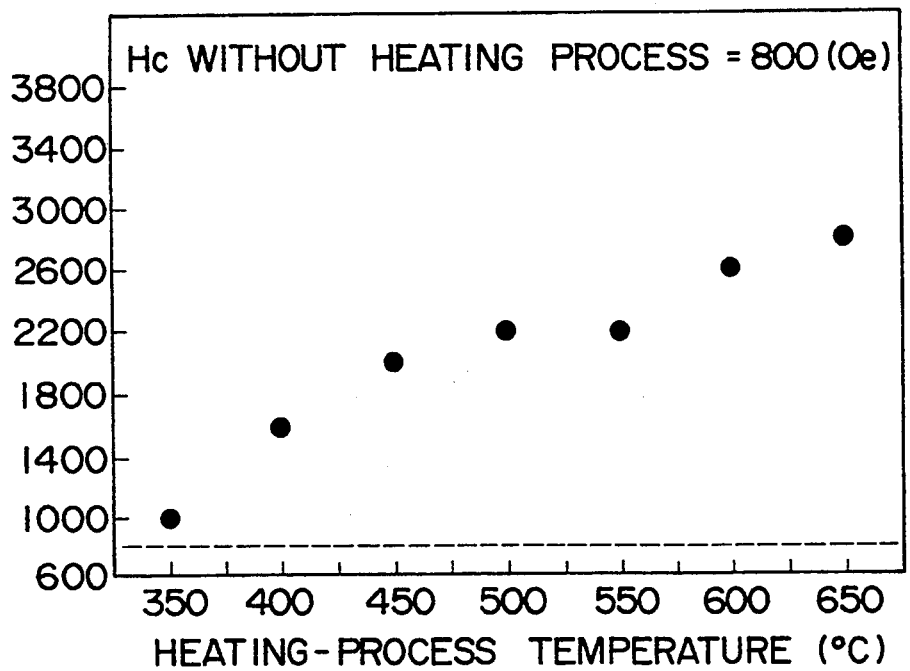
FIG. 4 is a chart showing an example of the relation between the heating-process temperature and the coercive force of a disk obtained in the embodiment 4 according to the invention described in claim 2.

The measurement results of coercive force, Hc, of the obtained disks are shown in FIG. 4. As seen from the figure, also in the case where protective layers were formed with Ta, magnetic disks having coercive force, Hc, which was remarkably improved in comparison with those of the disks without being subjected to heating processes or those in the comparison examples in the embodiment 1 were obtained.

About the magnetic disks prepared in this embodiment, a composition analysis in the direction of depth (thickness) was performed with the ESCA (electron spectroscopy for chemical analysis) method. In the result, it was found that a Ta layer was changed to a Ta oxide layer by the heating process. Further in the result of an environmental test similar to that in the embodiment 1, no change was observed in the values of the coercive force, Hc, the residual magnetic flux densities, Br, and the degrees of squareness, S, in comparison with the data before the environmental test, and it was confirmed that the Ta oxide layer has the function as a protective layer.

Embodiment 5

Magnetic disks were prepared in a similar method to that in the embodiment 1, excepting that the protective layers were formed with one of the following elements in place of Zr layers as protective layers, and the coercive force, Hc, of each disk was measured.

In the result, in a case where protective layers were formed with one of the following elements, Be, Mg, Al, Sc, Ti, V, Cr, Cu, Zn, Ge, Y, Nb, Mo, Pd, Hf, W, Pt, Au, Pb, Bi, La, Ce, Pr, Nd, or Eu, the disks having coercive force, Hc, which was remarkably improved were obtained in comparison with those of the disks which were not subjected to heating processes and those of disks in the comparison examples in the embodiment 1.

Embodiment 6

Magnetic disks were prepared in a similar method to that in the embodiment 1, excepting that protective layers were formed with one of the following elements in place of the Zr layers, and the coercive force, Hc, of each magnetic disk was measured.

In the result, also in the case where a protective layers were formed with one of the elements, NiP, SiN, SiC, TiC, ZnSe or ZnS, disks were obtained having coercive force, Hc, which was remarkably improved in comparison with the disks which were not subjected to heating processes and the disks in the comparison examples in the embodiment 1.

Embodiment 7

After a carbon substrate was subjected to a Pd activating process, a CoNiP layer of 600 Å thick as a magnetic layer of a Co alloy and a NiP layer of 300 Å thick as a protective layer were formed in order on a carbon substrate by an electroless plating method. Then they were subjected to heating processes similar to those in the embodiment 1 to prepare magnetic disks, and the coercive forces was measured.

In the result, magnetic disks having coercive force which was remarkably improved in comparison with those which were not subjected to heating processes were obtained. In a similar way to the case where a non-magnetic element, Cr, is contained in the magnetic layer of a Co alloy, the coercive force, Hc, is considered to be improved owing to the facts that a chemical compound of an element forming the NiP layer and P in the CoNiP layer was not generated and the segregation of P into the crystalline grain boundaries in the CoNiP layer was expedited.

Embodiment 8

After each carbon substrate was subjected to a Pd activating process, a CoNiPZn layer of 600 Å thick as a magnetic layer of a Co alloy and a NiP layer of 300 Å thick as a protective layer were formed on the carbon substrate with an electroless plating method. Then a heating process was performed similar to that in the embodiment 1 to prepare a magnetic disk, and the coercive force was measured.

In the result, the disks having coercive force, Hc, which was remarkably improved were obtained. In a similar way to the case where a non-magnetic element, Cr, was contained in the magnetic layer of a Co alloy, a chemical compound of an element forming the NiP layer and, P and Zn in the CoNiPZn layer was not generated, and the segregation of P and Zn into the crystalline grain boundaries in the CoNiPZn layer was expedited more effectively; owing to this, the coercive force, Hc, is considered to be improved.

Embodiment 9

After each carbon substrate was subjected to a Pd activating process, a CoNiP layer of 600 Å thick was formed as a magnetic layer of a Co alloy with an electroless plating method, and then a Zr layer of 300 Å thick was formed as a protective layer with a sputtering method. Then a heating process was performed similar to that in the embodiment 1 to prepare a magnetic disk, and the coercive force was measured. In the result, the disks having coercive forces, Hc, which was remarkably improved were obtained.

Embodiment 10

Magnetic disks were prepared in a similar method to that in the embodiment 1, excepting that titanium substrates (manufactured by Kobe Steel, pure titanium KS40, JIS 1st class) were used in place of carbon substrates.

Figure 5:
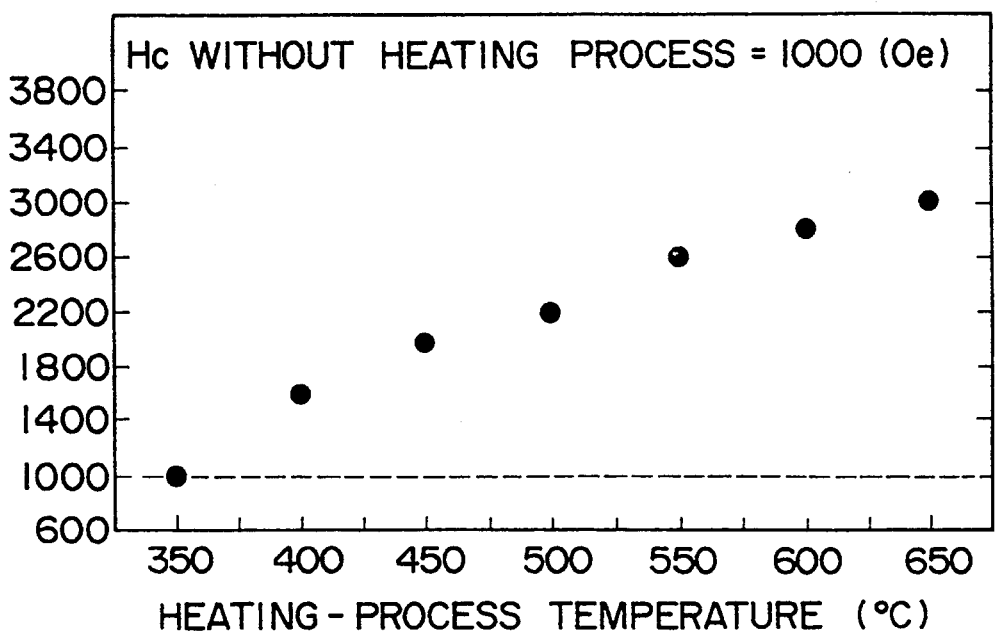
FIG. 5 is a chart showing an example of the relation between the heating-process temperature and the coercive force of a disk obtained in the embodiment 10 according to the invention described in claim 2.

The measured results of the coercive force are shown in FIG. 5. As seen from the figure, also in the case where titanium substrates were used, disks having the coercive force which was remarkably improved in comparison with the disks which were not heat-processed were obtained by performing heating processes.

Embodiment 11

Disks were prepared in a similar method to that in the embodiment 1, excepting that crystallized glass substrates having the composition of $SiO_2$-$Li_2O$-$Al_2O_3$ were used in place of carbon substrates as magnetic disk substrates.

Figure 6:
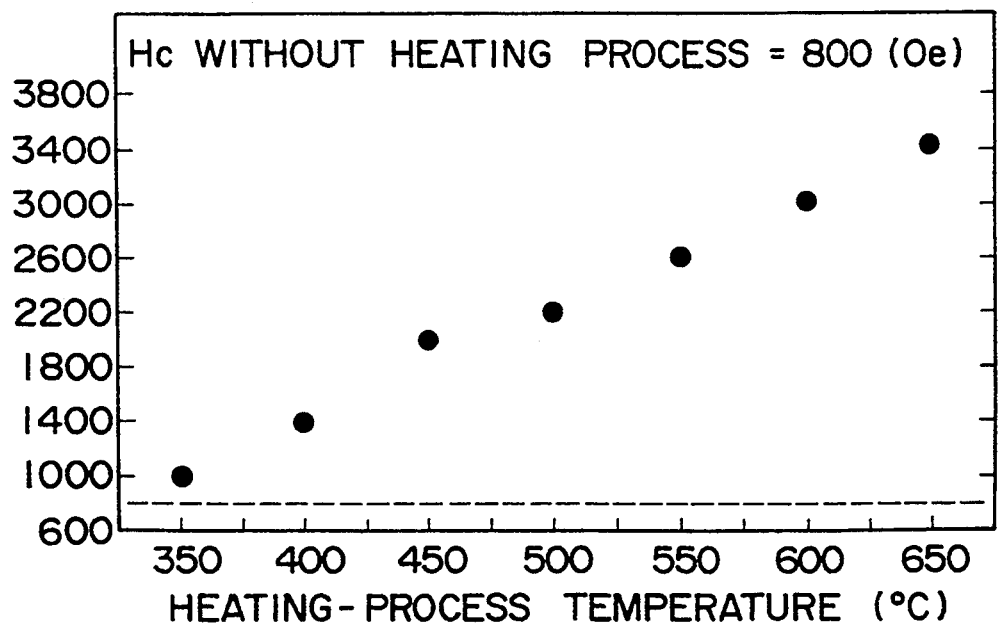
FIG. 6 is a chart showing an example of the relation between the heating-process temperature and the coercive force of a disk obtained in the embodiment 11 according to the invention described in claim 2.

The measured results of the coercive force, Hc, are shown in FIG. 6. As seen from the figure, also in the case where crystallized glass substrates were used, the disks having the coercive force which was remarkably improved in comparison with the disks which were not heat-processed were obtained by performing heating processes.

Embodiment 12

Magnetic disks were prepared in a similar method to that in the embodiment 1, excepting that tempered glass substrates were used as magnetic disk substrates in place of carbon substrates.

Figure 7:
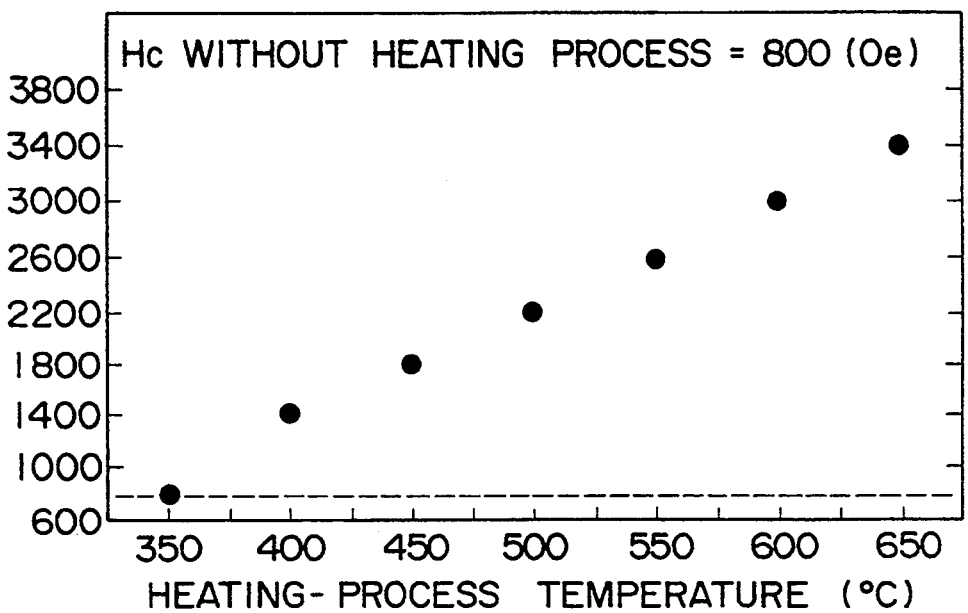
FIG. 7 is a chart showing an example of the relation between the heating-process temperature and the coercive force of a disk obtained in the embodiment 12 according to the invention described in claim 2.

The measurement results of their coercive force are shown in FIG. 7. As seen from the figure, also in the case where tempered glass substrates were used, the disks having coercive force, Hc, which was remarkably improved were obtained in performing heating processes in comparison with the disks which were not heat-processed.

Embodiment 13

Magnetic disks were prepared in a similar method to that in the embodiment 1, excepting that Si substrates were used as magnetic disk substrates in place of carbon substrates.

Figure 8:
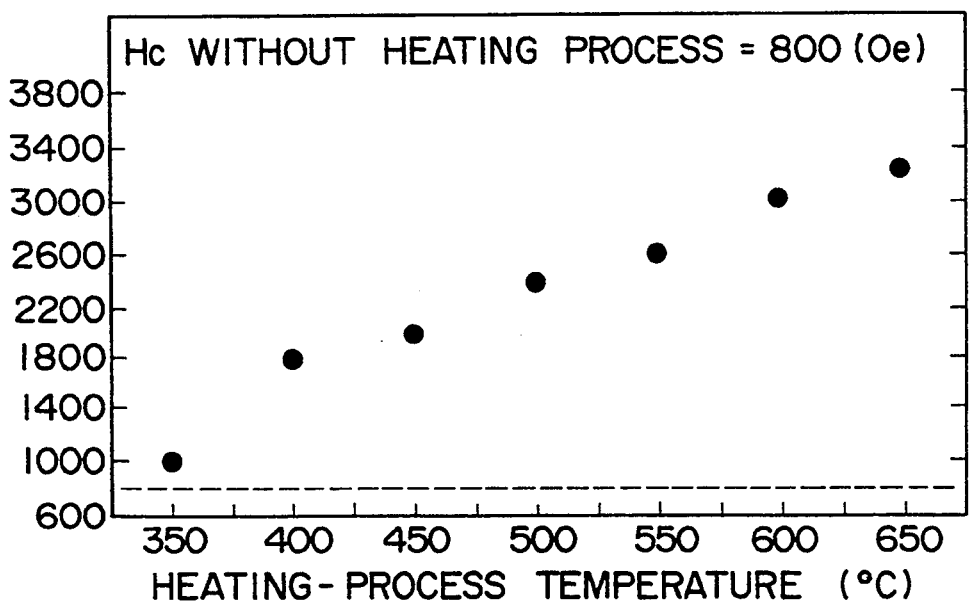
FIG. 8 is a chart showing an example of the relation between the heating-process temperature and the coercive force of a disk obtained in the embodiment 13 according to the invention described in claim 2.

The measurement results of their coercive force, Hc, are shown in FIG. 8. As seen from the figure, also in the case where silicon substrates were used the disks having coercive force which was remarkably improved were obtained in performing the heating processes in comparison with the disks which were not heat-processed.

An embodiment according to the invention described in claim 1 will be explained in the following.

Embodiment 14

A $Co_{62.5}Ni_{30}Cr_{7.5}$ layer of 600 Å thick as a magnetic substance layer and a Zr layer of 300 Å thick as a protective layer were formed in order on each carbon substrate with the use of a DC magnetron sputtering system. The temperature of each substrate was 250° C. The obtained work pieces were heat-processed for 1 min. in a vacuum environment (degree of vacuum: $30 \times 10^{-2}$ Torr) in changing the heating temperature in the range of 350 to 650° C., and a disk was prepared in each heating condition.

Figure 9:
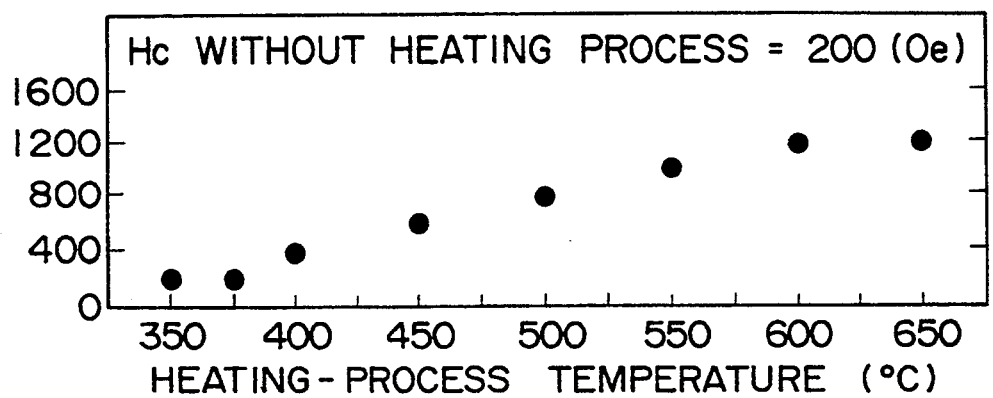
FIG. 9 is a chart showing an example of the relation between the heating-process temperature and the coercive force of a disk obtained in the embodiment 14 according to the invention described in claim 1.

The measured results of coercive force, Hc, are shown in FIG. 9. The coercive force of a disk which was not heat-processed was approximately 200 (Oe). As seen from the figure, even in the case of a disk which has no Cr under layer, the coercive force, Hc, of the disk was remarkably improved in comparison with a disk which was not heat-processed.

What is claimed is:

1. A manufacturing method of a magnetic disk having a protective layer being formed with a non-diffusive element, not diffusing into a magnetic layer of a Co alloy in a heating process comprising the steps of:
    forming the magnetic layer of a Co alloy and the protective layer of a non-diffusive element in order on a substrate; and
    heat-processing said substrate at a temperature higher than 250° C. in order to increase the coercive force of the magnetic disk.

2. A manufacturing method of a magnetic disk having a protective layer being formed with a non-diffusive element, not diffusing into a magnetic layer of a Co alloy in a heating process comprising the steps of:
    forming an under layer of Cr, a magnetic layer of a Co alloy, and the protective layer of a non-diffusive element in order on a substrate; and
    heat-processing said substrate at a temperature higher than 250° C. in order to increase the coercive force of the magnetic disk.

* * * * *